United States Patent
Mu et al.

(10) Patent No.: US 11,927,632 B1
(45) Date of Patent: Mar. 12, 2024

(54) DIMM SLOT TEST SYSTEM WITHOUT SERIES CONNECTION OF TEST BOARD THROUGH JTAG AND METHOD THEREOF

(71) Applicants: Inventec (Pudong) Technology Corporation, Shanghai (CN); Inventec Corporation, Taipei (TW)

(72) Inventors: Chang-Qing Mu, Shanghai (CN); Yuan Sang, Shanghai (CN); Xue-Shan Han, Shanghai (CN)

(73) Assignees: Inventec (Pudong) Technology Corporation, Shanghai (CN); Inventec Corporation, Taipei (TW)

( * ) Notice: Subject to any disclaimer, the term of this patent is extended or adjusted under 35 U.S.C. 154(b) by 0 days.

(21) Appl. No.: 18/064,093

(22) Filed: Dec. 9, 2022

(51) Int. Cl.
*G01R 31/28* (2006.01)
*G01R 31/3185* (2006.01)

(52) U.S. Cl.
CPC .......... *G01R 31/318533* (2013.01); *G01R 31/318536* (2013.01); *G01R 31/318572* (2013.01); *G01R 31/318597* (2013.01)

(58) Field of Classification Search
CPC .... G01R 31/318536; G01R 31/318572; G01R 31/318533; G01R 31/318597
USPC .................................................. 714/726, 729
See application file for complete search history.

(56) References Cited

U.S. PATENT DOCUMENTS

| | | | | |
|---|---|---|---|---|
| 5,513,135 A | * | 4/1996 | Dell | G11C 5/06 365/63 |
| 5,852,617 A | * | 12/1998 | Mote, Jr. | G06F 11/221 714/E11.161 |
| 10,810,338 B1 | * | 10/2020 | Mu | G01R 31/318583 |
| 2003/0187629 A1 | * | 10/2003 | Gomez | G01R 31/318583 703/23 |
| 2008/0147894 A1 | * | 6/2008 | Lu | G06F 11/2284 710/6 |
| 2011/0246712 A1 | * | 10/2011 | Vergis | G06F 13/1694 711/E12.001 |
| 2019/0178936 A1 | * | 6/2019 | Mu | G01R 31/68 |
| 2020/0132769 A1 | * | 4/2020 | Sang | G01R 31/318597 |
| 2020/0182932 A1 | * | 6/2020 | Wang | G01R 31/31715 |
| 2021/0072979 A1 | * | 3/2021 | Yang | G06F 8/654 |

\* cited by examiner

*Primary Examiner* — Shelly A Chase
*Assistant Examiner* — Osman M Alshack
(74) *Attorney, Agent, or Firm* — David R. Stevens; Stevens Law Group

(57) ABSTRACT

A DIMM slot test system without series connection of test board through JTAG and a method thereof are disclosed. A DIMM connector interface of a test board is inserted to a DIMM slot of a circuit board under test, a CPU generates test data or a test signal based on a test signal with JTAG signal format, the CPU transmits test data to a specified CPLD chip through differential pins or IO pins, the specified CPLD chip records the received data as a test result; the CPU transmits the generated test signal to the specified CPLD chip, which then tests power pins or ground pins, reads and records values of the power pins or the ground pins as the test result; the CPU generates and transmits a test result read signal to the specified CPLD chip through the control pins, obtains the test result through data transmission pins.

10 Claims, 7 Drawing Sheets

501 — Provide a circuit board under test that comprises a JTAG connection interface, a central processing unit, and at least one DIMM slot, wherein each of the at least one DIMM slot comprises power pins, ground pins, differential pins, and IO pins, wherein some of the IO pins are selected as data transmission pins, some of the IO pins are selected as control pins, wherein the differential pins, some of the IO pin, and the CPU are electrically connected to each other 502 — Provide at least one test board, wherein each of the at least one test board comprises a DIMM connector interface, and at least one CPLD chip electrically connected to the DIMM connector interface, the DIMM connector interface is inserted to one of the at least one DIMM slot 503 — Provide a TAP controller electrically connected to the circuit board under test through the JTAG connection interface 504 — Provide a test device electrically connected to the TAP controller 505 — Generate a test signal, and providing the test signal to the TAP controller, by the test device (A)

FIG. 4A

DIMM SLOT TEST SYSTEM WITHOUT SERIES CONNECTION OF TEST BOARD THROUGH JTAG AND METHOD THEREOF

CROSS-REFERENCE TO RELATED APPLICATION

This application claims the benefit of Chinese Application Serial No. 202211434346.3, filed Nov. 16, 2022, which is hereby incorporated herein by reference in its entirety.

BACKGROUND OF THE INVENTION

1. Field of the Invention

The present invention relates to a slot test system and a method thereof, and more particularly to a slot test system in which a test board inserted in a DIMM slot is able to test the DIMM slot independently without series connection of test board through joint test action group (JTAG), and a method thereof.

2. Description of the Related Art

For the boundary scan test of a dual in-line memory module (DIMM) slot in the existing device, a DIMM test board must be inserted into the DIMM slot; according to the specification of boundary scan test technology, the DIMM test board requires two JTAG connection interfaces, which include a JTAG IN connection interface and a JTAG OUT connection interface, to ensure that the JTAG signal can be transmitted to and from the DIMM test board to perform the boundary scan test on the DIMM slot.

However, when the boundary scan test of DIMM slot is actually performed, each DIMM test board needs to form a serial connection through the JTAG IN connection interface and the JTAG OUT connection interface, it may cause the serial connection line too long, and impact stability of the line connection. During a testing process, the driving ability and stability of the JTAG signal must meet certain requirements, the insufficient stability of the line connection may cause failure of the boundary scan test of the DIMM slot.

According to above-mentioned contents, what is needed is to develop an improved solution to solve the conventional problem that the circuit connection formed by series connection through JTAG IN connection interface and the JTAG OUT connection interface has insufficient stability and may cause failure of a boundary scan test of a DIMM slot.

SUMMARY OF THE INVENTION

An objective of the present invention is to disclose a DIMM slot test system without series connection of test board through JTAG and a method thereof, to solve the problem that a circuit connection formed by series connection through JTAG IN connection interface and the JTAG OUT connection interface has insufficient stability and may cause failure of a boundary scan test of a DIMM slot.

In order to achieve the objective, the present invention discloses a DIMM slot test system without series connection of test board through JTAG, and the DIMM slot test system includes a circuit board under test, at least one test board, a test access port (TAP) controller and a test device. The circuit board under test includes a JTAG connection interface, a central processing unit and at least one DIMM slot, wherein each of the at least one DIMM slot comprises power pins, ground pins, differential pins and IO pins, some of the IO pins are selected as data transmission pins, some of the IO pins are selected as control pins, wherein the differential pin, at least some of the IO pins and the CPU are electrically connected to each other. Each test board includes a DIMM connector interface and at least one complex programmable logic device (CPLD) chip. The DIMM connector interface is inserted into one of the at least one DIMM slot. The at least one CPLD chip is electrically connected to the DIMM connector interface. The TAP controller is electrically connected to the circuit board under test through the JTAG connection interface. The test device is electrically connected to the TAP controller. The test device generates a test signal and provide the test signal to the TAP controller, the TAP controller converts the test signal into a second test signal with JTAG signal format and provides the second test signal to the CPU, the CPU generates test data or a third test signal based on the second test signal with JTAG signal format, the CPU transmits the test data to specified one of the at least one CPLD chip through the differential pins or the IO pins, the specified one of the at least one CPLD chip records the received data as a test result, the CPU transmits the third test signal to the specified one of the at least one CPLD chip through the control pins, the specified one of the at least one CPLD chip tests the power pins or the ground pins to read and record values of the power pins or the ground pins as the test result, the CPU generates a test result read signal and transmits the test result read signal to the specified one of the at least one CPLD chip through the control pins, to obtain the test result through the data transmission pin and send the test result to the test device.

In order to achieve the objective, the present invention discloses a DIMM slot test method without series connection of test board through JTAG, and the DIMM slot test method includes steps of: providing a circuit board under test that comprises a JTAG connection interface, a central processing unit, and at least one DIMM slot, wherein each of the at least one DIMM slot comprises power pins, ground pins, differential pins, and IO pins, wherein some of the IO pins are selected as data transmission pins, some of the IO pins are selected as control pins, wherein the differential pins, some of the IO pin, and the CPU are electrically connected to each other; providing at least one test board, wherein each of the at least one test board comprises a DIMM connector interface, and at least one CPLD chip electrically connected to the DIMM connector interface, the DIMM connector interface is inserted to one of the at least one DIMM slot; providing a TAP controller electrically connected to the circuit board under test through the JTAG connection interface; providing a test device electrically connected to the TAP controller; generating a test signal, and providing the test signal to the TAP controller, by the test device; converting the test signal into a second test signal with JTAG signal format, and providing the second test signal with JTAG signal format to the CPU, by the TAP controller; generating test data or a third test signal based on the second test signal with JTAG signal format, by The CPU; transmitting the test data to specified one of the at least one CPLD chip through the differential pins or the IO pins, by the CPU, wherein the specified one of the at least one CPLD chip records the received data as a test result; transmitting the third test signal to the specified one of the at least one CPLD chip through the control pins, by the CPU, wherein the specified one of the at least one CPLD chip tests the power pins or the ground pins to read and record values of the power pins or the ground pins as the test result; generating a test result read signal, transmitting the test result read signal to the specified one of the at least one CPLD chip through the control pins, obtaining the test result through the data transmission pins, and sending the test result to the test device, by the CPU.

According to the above-mentioned system and method of the present invention, the difference between the present invention and the conventional technology is that the DIMM connector interface of the test board is inserted to the DIMM slot of the circuit board under test, the CPU generates the test data or the test signal based on the test signal with JTAG signal format, the CPU transmits the test data to the specified CPLD chip through the differential pins or the IO pins, the specified CPLD chip records the received data as the test result; the CPU transmits the generated test signal to the specified CPLD chip through the control pins, the specified CPLD chip tests the power pins or the ground pins, reads and records values of the power pins or the ground pins as the test result; the CPU generates and transmits the test result read signal to the specified CPLD chip through the control pins, obtains the test result through data transmission pins, and sends the test result to the test device.

Therefore, the above-mentioned solution of the present invention is able to achieve the technical effect of testing pins of the DIMM slots of the circuit board under test independently by the test board.

BRIEF DESCRIPTION OF THE DRAWINGS

The structure, operating principle and effects of the present invention will be described in detail by way of various embodiments which are illustrated in the accompanying drawings.

FIGS. 4A and 4B are flowcharts of a DIMM slot test method without series connection of test board through JTAG, according to the present invention.

DETAILED DESCRIPTION OF THE PREFERRED EMBODIMENTS

Figure 1:
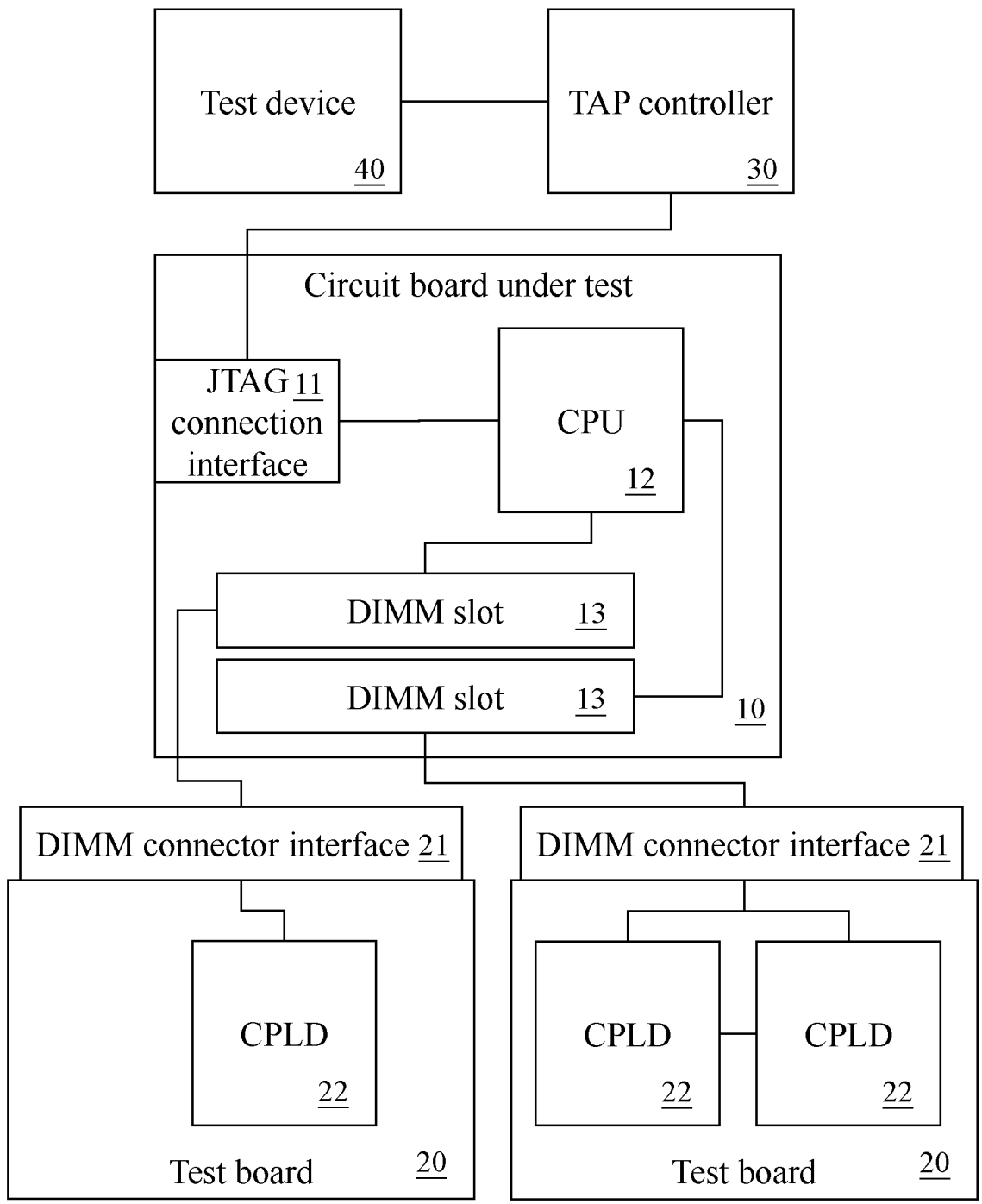
FIG. 1 is a block diagram of a DIMM slot test system without series connection of test board through JTAG, according to the present invention.

The following embodiments of the present invention are herein described in detail with reference to the accompanying drawings. These drawings show specific examples of the embodiments of the present invention. These embodiments are provided so that this disclosure will be thorough and complete, and will fully convey the scope of the invention to those skilled in the art. It is to be acknowledged that these embodiments are exemplary implementations and are not to be construed as limiting the scope of the present invention in any way. Further modifications to the disclosed embodiments, as well as other embodiments, are also included within the scope of the appended claims.

These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts. As used herein, the singular forms "a", "an" and "the" are intended to include the plural forms as well, unless the context clearly indicates otherwise.

It is to be acknowledged that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the words "comprise" and "include", and variations such as "comprises", "comprising", "includes", or "including", will be acknowledged to imply the inclusion of stated elements but not the exclusion of any other elements.

A DIMM slot test system without series connection of test board through JTAG according to the present invention will be illustrated in the following paragraphs. Please refer to FIG. 1, which is a system block diagram of a DIMM slot test system without series connection of test board through JTAG, according to the present invention.

As shown in FIG. 1, the DIMM slot test system includes a circuit board under test 10, at least one test board 20, a TAP controller 30, and a test device 40.

Figure 2A:
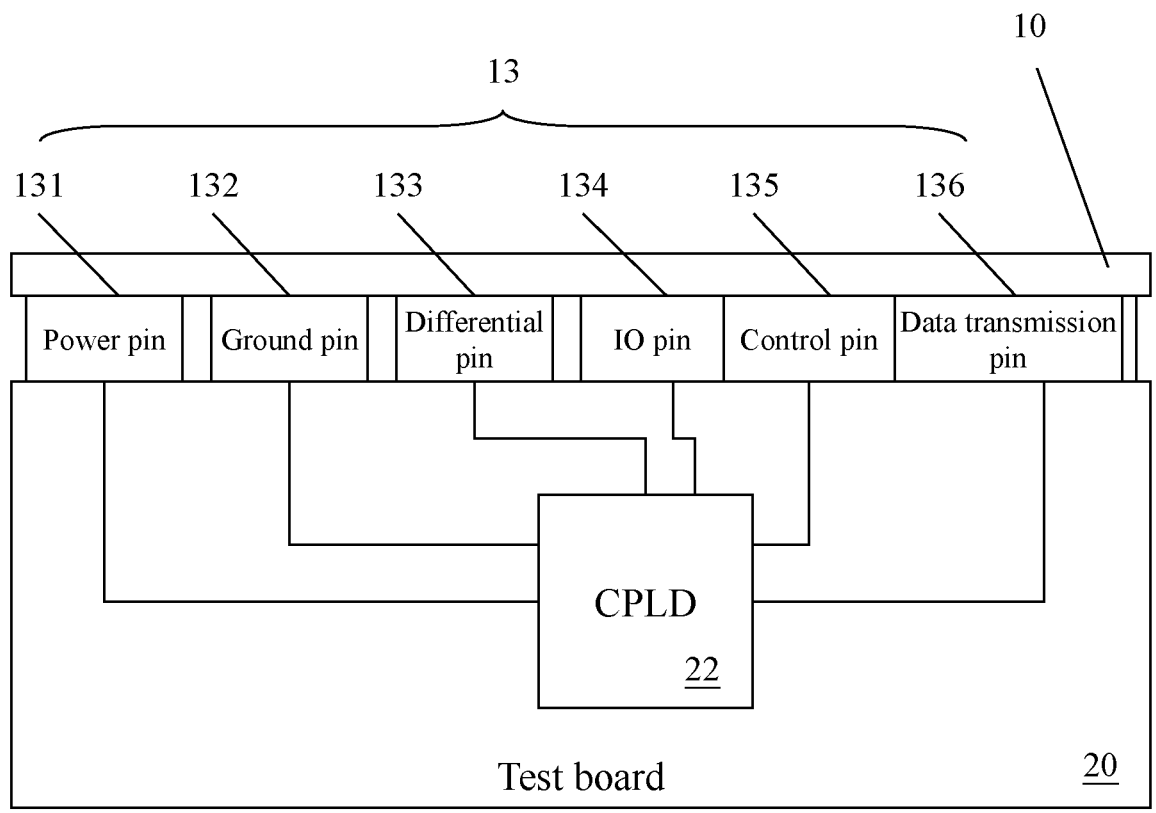
FIG. 2A is a block diagram of a test board and a DIMM slot of a first embodiment of the present invention.

The circuit board under test 10 includes a JTAG connection interface 11, a CPU 12, and at least one DIMM slot 13. The JTAG connection interface 11 is electrically connected to the CPU 12; each of the at least one DIMM slot 13 includes power pins 131, ground pins 132, differential pins 133, and IO pins 134, as shown in FIG. 2A. Some of the IO pin 134 are selected as control pins 135, some of the IO pin 134 are selected as data transmission pins 136; the differential pins 133, the IO pins 134 and the CPU 12 are electrically connected to each other.

Each of the test board 20 includes a DIMM connector interface 21 and a CPLD chip 22; the number of the test boards 20 is the same as the number of the DIMM slots 13 of the circuit board under test 10. The DIMM connector interface 21 is inserted to one of the at least one DIMM slot 13.

Please refer to FIG. 2A, which is a block diagram of a test board and a DIMM slot of a first embodiment of the present invention. The first embodiment of FIG. 2A has single CPLD chip 22, so the CPLD chip 22 is electrically connected to the DIMM connector interface 21, and the power pins 131, the ground pins 132, the differential pins 133, the IO pins 134, the control pins 135 and the data transmission pins 136 of the DIMM slot 13 are electrically connected to the single CPLD chip 22; however, the embodiment is merely for exemplary illustration, and the application field of the present invention is not limited to this example.

Figure 2B:
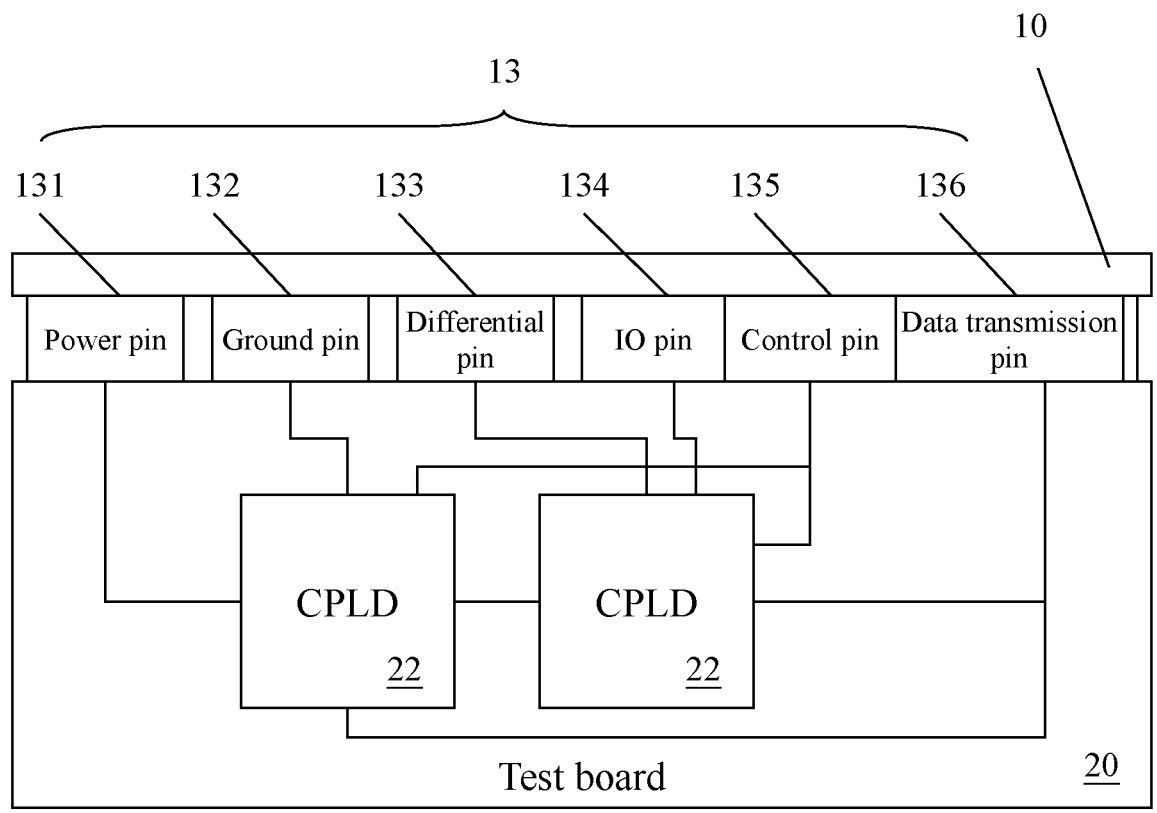
FIG. 2B is a block diagram of a test board and a DIMM slot of a second embodiment of the present invention.

Please refer to FIG. 2B, which is a block diagram of a test board and a DIMM slot of second embodiment of the present invention. The second embodiment of FIG. 2B has two CPLD chips 22, each CPLD chip 22 is electrically connected to the DIMM connector interface 21; it should be noted that the power pins 131, the ground pins 132, the control pins 135 and the data transmission pins 136 of the DIMM slot 13 are electrically connected to one of the two CPLD chips 22, and the differential pins 133, the IO pins 134, the control pins 135 and the data transmission pins 136 of the DIMM slot 13 are electrically connected to the other of the two CPLD chips 22; however, the embodiment is merely for exemplary illustration, and the application field of the present invention is not limited to this example.

The TAP controller 30 is electrically connected to the circuit board under test 10 through the JTAG connection interface 11, the test device 40 is electrically connected to the TAP controller 30, so that whole test architecture for testing a DIMM slot without series connection of test board through JTAG can be constructed.

According to the above-mentioned content, some of the IO pins are used as the data transmission pins that are used for data transmission between the CPU 12 and the CPLD chip 22. Selecting IO pin as the data transmission pin needs to satisfy the following conditions: the IO pin has not selected as the control pin yet, the IO pin is electrically connected to the CPU 12, and the IO pin is provided with a read/write function with the CPU 12.

Particularly, in the DIMM slot 13 defined in the DDR5 DIMM specification, at most 104 IO pins can be selected as the data transmission pins, the DIMM slot 13 defined in the DDR5 DIMM specification, that is, at most 104 IO pins are electrically connected to the CPU 12, and the at most 104 IO pins have not selected as the control pin yet, and each of the at most 104 IO pins is provided with the read/write function with the CPU 12.

In the DIMM slot 13 defined by the DDR5 DIMM specification, the IO pin not electrically connected to the CPU 12, or the IO pin electrically connected to the CPU 12 but having a unidirectional data transmission direction (that is, the IO pin can read data or write data only) cannot be selected as the data transmission pin. In addition, in the DIMM slot 13 defined by the DDR5 DIMM specification, the power pins and the ground pins are not electrically connected to the CPU 12, so the power pins and the ground pins cannot be selected as the data transmission pin.

In the DIMM slot 13 defined by the DDR5 DIMM specification, the differential pins are electrically connected to the CPU 12, but the boundary scan cell of the CPU 12 has a fixed direction and does not have the read/write function, so the differential pins cannot be selected as the data transmission pins.

According to the above-mentioned content, some of the IO pin are selected as the control pins, the embodiment of the control pin selection will be illustrated in the following paragraphs according to the definition of the DDR5 DIMM specification.

In the definition of DDR5 DIMM specification, a fourth pin of the DDR5 DIMM slot (that is the "pin 4" defined in the DDR5 DIMM specification) is a serial clock (SCL) pin of the improved inter integrated circuit (I3C) bus, a fifth pin of DDR5 DINM slot (that is, the "pin 5" defined in the DDR5 DIMM specification) is serial data (SDA) pin of the I3C bus. Generally, in circuit design of the circuit board under test 10, the fourth pins and the fifth pins of eight DIMM slots 13 are connected together first and electrically connected to the CPU 12; in order to reduce the number of the DIMM slots 13 for chip select control, the fourth pin of the DDR5 DIMM slot is selected as the WE_n control pin (that is, write enable), and the fifth pin of the DDR5 DIMM slot is selected as the OE_n control pin (that is, read enable).

In the definition of the DDR5 DIMM specification, the 64th pin of the DDR5 DIMM slot (that is, the pin 64 defined in the DDR5 DIMM specification) is one of the chip-select pins of the DIMM slot 13, so the 64th pin of the DDR5 DIMM slot is selected as the CE_n control pin (that is, chip-select enable).

The communication control between the CPU 12 of the circuit board under test 10 and the CPLD chip 22 of the test board 20 can be implemented by selecting the fourth pin, the fifth pin and the 64th pin of the DDR5 DIMM slot; these examples are merely for exemplary illustration, and the application field of the present invention is not limited to these examples.

In addition, in the DDR5 DIMM slot defined in the DDR5 DIMM specification, the 209th pin (that is, the "pin 209" defined in the DDR5 DIMM specification) is one of the chip-select pins of the DIMM slot 13, the 209th pin of the DDR5 DIMM slot is selected as the PTN_IDX control pin (that is, the test pattern instruction), so that the PTN_IDX control pin can be the instruction of test pattern. Particularly, in a condition that the test logic has two test patterns, when the PTN_IDX control pin is 0, it indicates that the first test pattern is currently used to perform test; when the PTN_IDX control pin is 1, it indicates that the second test pattern is currently used to perform test; these examples are merely for exemplary illustration, and the application field of the present invention is not limited to these examples.

The test device 40 can be, for example, a general computer, a notebook computer or a tablet computer, but these examples are merely for exemplary illustration, and the application field of the present invention is not limited to these examples. An inspector generates and provides the test signal to the TAP controller 30 through the test device 40, the TAP controller 30 converts the test signal into a test signal with JTAG signal format, provide the test signal with JTAG signal format to the CPU 12 through the JTAG connection interface 11, the CPU 12 generates test data or a test signal based on the test signal with JTAG signal format. The CPU 12 transmits the test data to the specified CPLD chip 22 through the differential pins 133 or the IO pins 134, and the specified CPLD chip 22 records the received data as the test result. The CPU 12 transmits the generated test signal to the specified CPLD chip 22 through the control pins 135, the specified CPLD chip 22 tests the power pins 131 or the ground pins 132 to read and record values of the power pins 131 or the ground pins 132 as the test result. The CPU 12 generates and transmits a test result read signal to the specified CPLD chip 22 through the control pin 135, to obtain the test result from the data transmission pin 136 and send the test result to the test device 40.

It should be noted that, the CPU 12 transmits the test data or the test signal to all DIMM slots 13 at the same time, the test board 20 tests the DIMM slots 13 and records the test results at the same time. In a general design, two DIMM slots 13 are located in the same channel, so when the CPU 12 generates a test result read signal, one of the two DIMM slots 13 in each channel is selected to obtain the test result of the selected DIMM slot 13 in the channel, and the other of the two DIMM slots 13 in each channel is then selected to obtain the test result of the selected DIMM slot 13 in the channel, so as to obtain the test results of all DIMM slots 13.

It should be noted that, the test signal generated by the CPU 12 based on the test signal with JTAG signal format is a power test signal or a ground test signal, the CPU 12 transmits the power test signal to the specified CPLD chip 22 through the control pins 135, the specified CPLD chip 22 tests the power pin 131 to read and record values of the power pins 131 as a power test result; or the CPU 12 transmits the ground test signal to the specified CPLD chip 22 through the control pins 135, the specified CPLD chip 22 tests the ground pins 132 to read and record the value of the ground pin 132 as a ground test result.

Figure 3A:
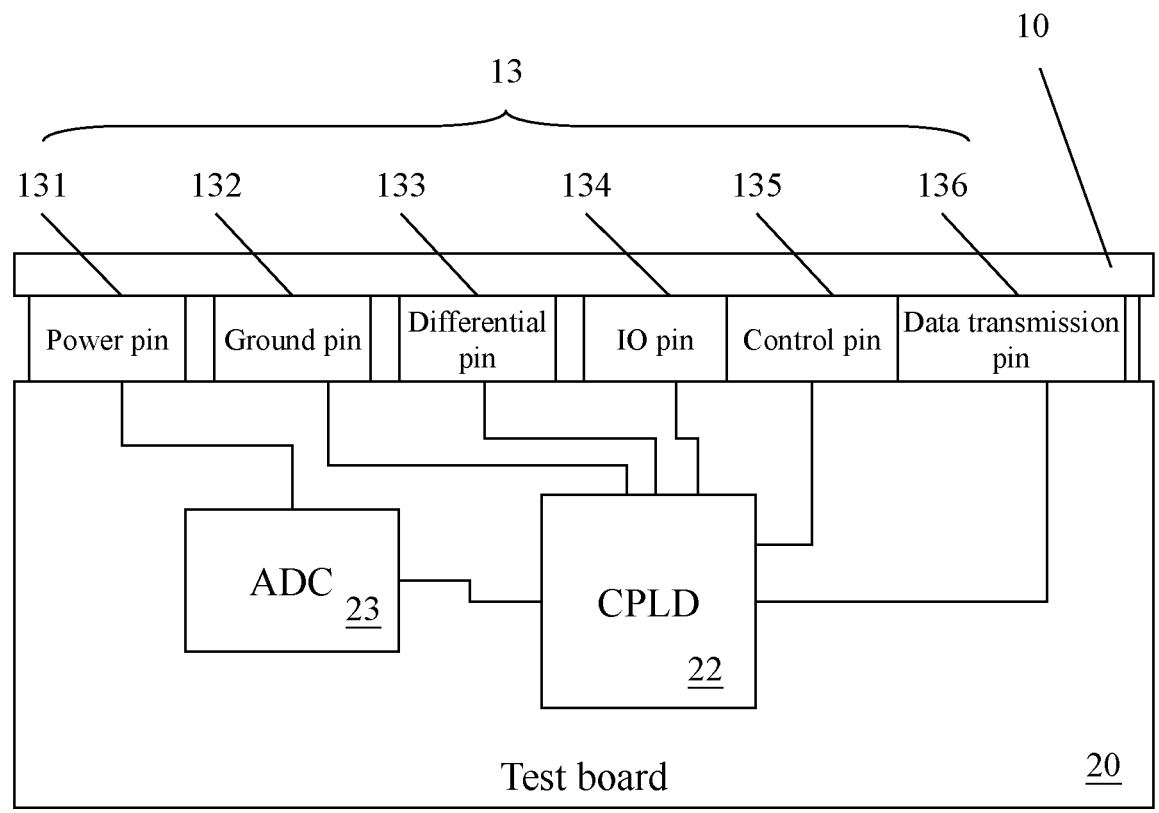
FIG. 3A is a block diagram of a test board, which is a variance of the first embodiment of FIG. 2A, according to the present invention.
Figure 3B:
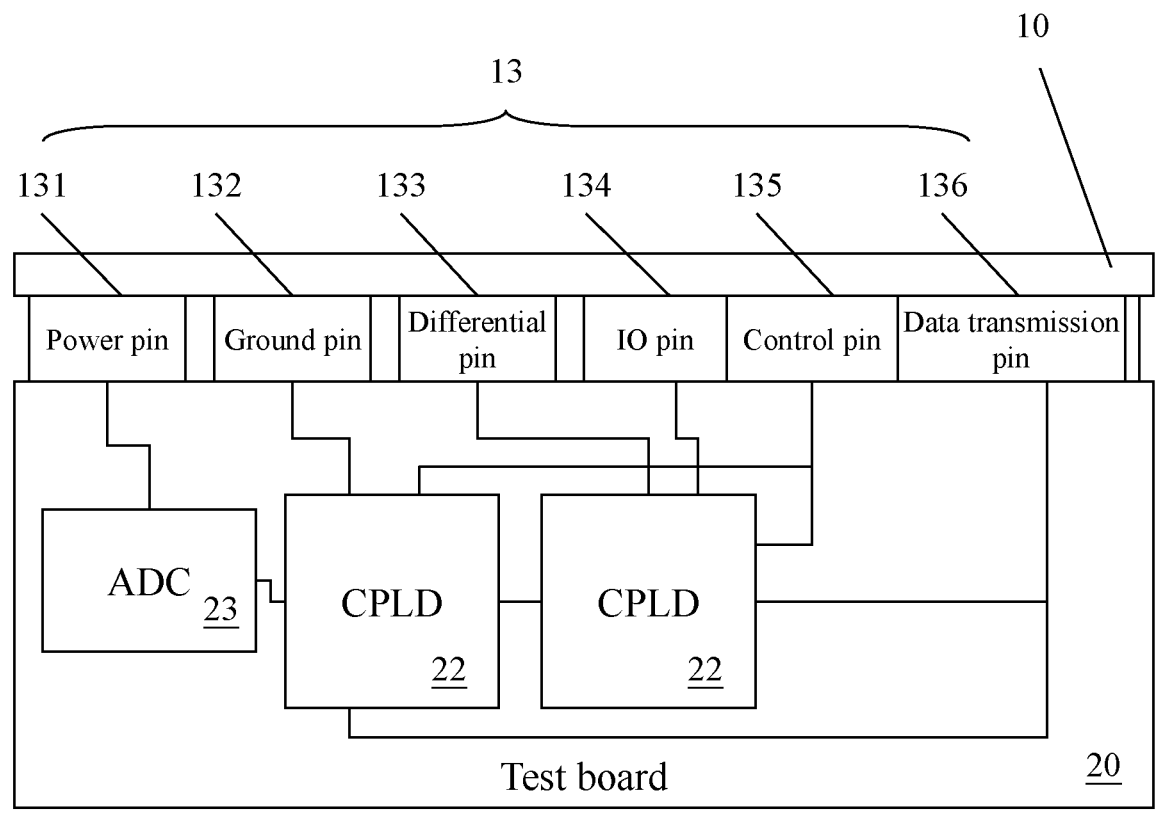
FIG. 3B is a block diagram of a test board, which is a variance of the second embodiment of FIG. 2B, according to the present invention.

In an embodiment, the CPLD chip 22 can be electrically connected to the power pins through an analog-to-digital converter 23 or single chip, the test signal generated by the CPU 12 based on the test signal with JTAG signal format is a power test signal, the CPU 12 transmits the power test signal to the specified CPLD chip 22 through the control pins 135, the specified CPLD chip 22 tests the power pins 131 of the DIMM slot 13 through the ADC 23 or single chip, the ADC 23 or single chip can read the values of the power pins 131 of the DIMM slot 13. The test board 20 is shown in FIGS. 3A and 3B. FIG. 3A is a block diagram of a test board which is a variance of the first embodiment of FIG. 2A, according to the present invention. FIG. 3B is a block diagram of a test board which is a variance of the second embodiment of FIG. 2B, according to the present invention. The ADC 23 shown in FIGS. 3A and 3B is just a schematic example, but the application field of the present invention is not limited thereto.

The test data generated by the CPU 12 based on the test signal with JTAG signal format is differential test data, the CPU 12 transmits the differential test data to the specified CPLD chip 22 through the differential pin 133, the specified CPLD chip 22 records the received data as a differential test result.

The test data generated by the CPU 12 based on the test signal with JTAG signal format is IO test data, the CPU 12 transmits the IO test data to the specified CPLD chip 22 through the IO pins 134, and the CPLD chip 22 records the received data as an IO test result.

Figure 4B:
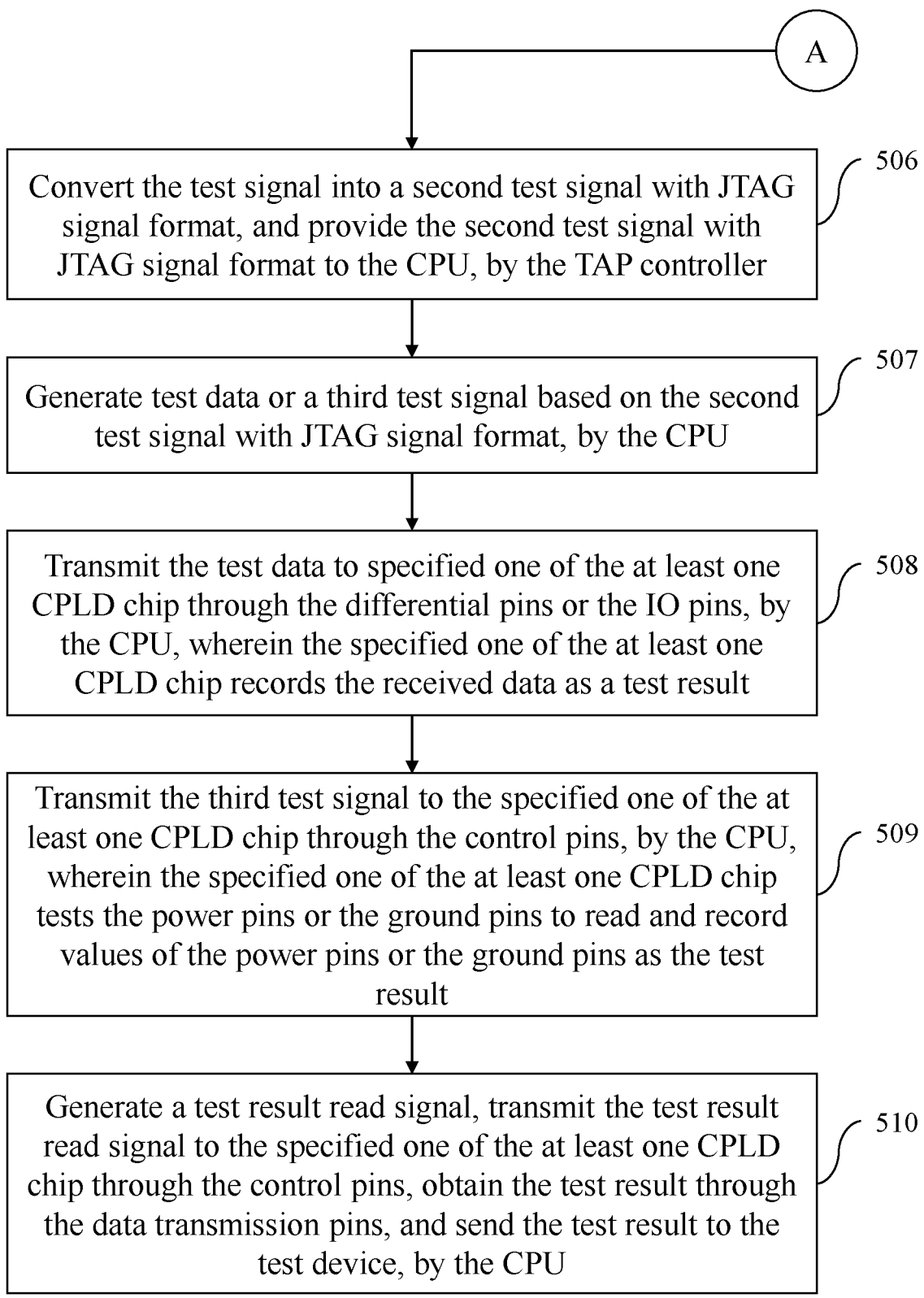

The operation of the system and the method of the present invention will be illustrated with reference to a first embodiment in the following paragraphs. Please refer to FIGS. 4A and 4B, which are flowcharts of a DIMM slot test method without series connection of test board through JTAG, according to the present invention.

The DIMM slot test method includes the following steps. In a step 501, a circuit board under test that comprises a JTAG connection interface, a central processing unit, and at least one DIMM slot, is provided; wherein each of the at least one DIMM slot comprises power pins, ground pins, differential pins, and IO pins, wherein some of the IO pins are selected as data transmission pins, some of the IO pins are selected as control pins, wherein the differential pins, some of the IO pin, and the CPU are electrically connected to each other. In a step 502, at least one test board is provided, wherein each of the at least one test board comprises a DIMM connector interface, and at least one CPLD chip electrically connected to the DIMM connector interface, the DIMM connector interface is inserted to one of the at least one DIMM slot. In a step 503, a TAP controller electrically connected to the circuit board under test through the JTAG connection interface is provided. In a step 504, a test device electrically connected to the TAP controller is provided. In a step 505, the test device generates a test signal, and provides the test signal to the TAP controller. In a step 506, the TAP controller converts the test signal into a second test signal with JTAG signal format, and provides the second test signal with JTAG signal format to the CPU. In a step 507, the CPU generates test data or a third test signal based on the second test signal with JTAG signal format. In a step 508, the CPU transmits the test data to specified one of the at least one CPLD chip through the differential pins or the IO pins, wherein the specified one of the at least one CPLD chip records the received data as a test result. In a step 509, the CPU transmits the third test signal to the specified one of the at least one CPLD chip through the control pins, wherein the specified one of the at least one CPLD chip tests the power pins or the ground pins to read and record values of the power pins or the ground pins as the test result. In a step 510, the CPU generates a test result read signal, transmits the test result read signal to the specified one of the at least one CPLD chip through the control pins, obtains the test result through the data transmission pins, and sends the test result to the test device.

According to above-mentioned contents, the difference between the present invention and the conventional technology is that the DIMM connector interface of the test board is inserted to the DIMM slot of the circuit board under test, the CPU generates the test data or the test signal based on the test signal with JTAG signal format, the CPU transmits the test data to the specified CPLD chip through the differential pins or the IO pins, the specified CPLD chip records the received data as the test result; the CPU transmits the generated test signal to the specified CPLD chip through the control pins, the specified CPLD chip tests the power pins or the ground pins, reads and records values of the power pins or the ground pins as the test result; the CPU generates and transmits the test result read signal to the specified CPLD chip through the control pins, obtains the test result through data transmission pins, and sends the test result to the test device.

Therefore, the above-mentioned solution of the present invention is able to solve the problem that a circuit connection formed by series connection through JTAG IN connection interface and the JTAG OUT connection interface has insufficient stability and may cause failure of a boundary scan test of a DIMM slot, so as to achieve the technical effect of testing pins of the DIMM slots of the circuit board under test independently by the test board.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A dual in-line memory module (DIMM) slot test system without series connection of test board through joint test action group (JTAG), wherein the DIMM slot test system comprises
   a circuit board under test, comprising a JTAG connection interface, a central processing unit and at least one DIMM slot, wherein each of the at least one DIMM slot comprises power pins, ground pins, differential pins and IO pins, some of the IO pins are selected as data transmission pins, some of the IO pins are selected as control pins, wherein the differential pin, at least some of the IO pins and the CPU are electrically connected to each other;
   at least one test board, wherein each of the at least one test board comprises:
      a DIMM connector interface, inserted into one of the at least one DIMM slot; and
      at least one complex programmable logic device (CPLD) chip, electrically connected to the DIMM connector interface;

a test access port (TAP) controller, electrically connected to the circuit board under test through the JTAG connection interface; and a test device, electrically connected to the TAP controller;

wherein the test device generates a test signal and provide the test signal to the TAP controller, the TAP controller converts the test signal into a second test signal with JTAG signal format and provides the second test signal to the CPU, the CPU generates test data or a third test signal based on the second test signal with JTAG signal format, the CPU transmits the test data to specified one of the at least one CPLD chip through the differential pins or the IO pins, the specified one of the at least one CPLD chip records the received data as a test result, the CPU transmits the third test signal to the specified one of the at least one CPLD chip through the control pins, the specified one of the at least one CPLD chip tests the power pins or the ground pins to read and record values of the power pins or the ground pins as the test result, the CPU generates a test result read signal and transmits the test result read signal to the specified one of the at least one CPLD chip through the control pins, to obtain the test result through the data transmission pin and send the test result to the test device.

2. The DIMM slot test system without series connection of test board through JTAG according to claim 1, wherein the third test signal generated by the CPU based on the second test signal with JTAG signal format is a power test signal or a ground test signal, the CPU transmits the power test signal to the specified one of the at least one CPLD chip through the control pins, the specified one of the at least one CPLD chip tests the power pins to read and record the values of the power pin as a power test result, or the CPU transmits the ground test signal to the specified one of the at least one CPLD chip through the control pins, the specified one of the at least one CPLD chip tests the ground pins to read and record the values of the ground pins as a ground test result.

3. The DIMM slot test system without series connection of test board through JTAG according to claim 1, wherein the test board further comprises an analog-to-digital converter (ADC), the ADC is electrically connected to the specified CPLD chip, and the DIMM connector interface, the third test signal generated by the CPU based on the second test signal with JTAG signal format is a power test signal, the CPU transmits the power test signal to the specified one of the at least one CPLD chip through the control pins, the specified one of the at least one CPLD chip tests the power pins through the ADC, the ADC reads the values of the power pins, the specified one of the at least one CPLD chip reads the values of the power pins from the ADC and records the values as the power test result.

4. The DIMM slot test system without series connection of test board through JTAG according to claim 1, wherein the test data generated by the CPU based on the second test signal with JTAG signal format is differential test data, the CPU transmits the differential test data to the specified one of the at least one CPLD chip through the differential pins, the specified one of the at least one CPLD chip records the received data as a differential test result.

5. The DIMM slot test system without series connection of test board through JTAG according to claim 1, wherein the test data generated by the CPU based on the second test signal with JTAG signal format is IO test data, the CPU transmits the IO test data to the specified one of the at least one CPLD chip through the IO pins, and the specified one of the at least one CPLD chip records the received data as an IO test result.

6. A dual in-line memory module (DIMM) slot test method without series connection of test board through joint test action group (JTAG), comprising:

providing a circuit board under test that comprises a JTAG connection interface, a central processing unit, and at least one DIMM slot, wherein each of the at least one DIMM slot comprises power pins, ground pins, differential pins, and IO pins, wherein some of the IO pins are selected as data transmission pins, some of the IO pins are selected as control pins, wherein the differential pins, some of the IO pin, and the CPU are electrically connected to each other;

providing at least one test board, wherein each of the at least one test board comprises a DIMM connector interface, and at least one CPLD chip electrically connected to the DIMM connector interface, the DIMM connector interface is inserted to one of the at least one DIMM slot;

providing a TAP controller electrically connected to the circuit board under test through the JTAG connection interface;

providing a test device electrically connected to the TAP controller;

generating a test signal, and providing the test signal to the TAP controller, by the test device;

converting the test signal into a second test signal with JTAG signal format, and providing the second test signal with JTAG signal format to the CPU, by the TAP controller;

generating test data or a third test signal based on the second test signal with JTAG signal format, by the CPU;

transmitting the test data to specified one of the at least one CPLD chip through the differential pins or the IO pins, by the CPU, wherein the specified one of the at least one CPLD chip records the received data as a test result;

transmitting the third test signal to the specified one of the at least one CPLD chip through the control pins, by the CPU, wherein the specified one of the at least one CPLD chip tests the power pins or the ground pins to read and record values of the power pins or the ground pins as the test result; and generating a test result read signal, transmitting the test result read signal to the specified one of the at least one CPLD chip through the control pins, obtaining the test result through the data transmission pins, and sending the test result to the test device, by the CPU.

7. The DIMM slot test method without series connection of test board through JTAG according to claim 6, wherein the third test signal generated by the CPU based on the second test signal with JTAG signal format is a power test signal or a ground test signal, the CPU transmits the power test signal to the specified one of the at least one CPLD chip through the control pins, the specified one of the at least one CPLD chip tests the power pins to read and record the values of the power pin as a power test result, or the CPU transmits the ground test signal to the specified one of the at least one CPLD chip through the control pins, the specified one of the at least one CPLD chip tests the ground pins to read and record the values of the ground pins as a ground test result.

8. The DIMM slot test method without series connection of test board through JTAG according to claim 6, wherein the test board further comprises an analog-to-digital converter (ADC), the ADC is electrically connected to the specified CPLD chip, and the DIMM connector interface, the third test signal generated by the CPU based on the second test signal with JTAG signal format is a power test signal, the CPU transmits the power test signal to the specified one of the at least one CPLD chip through the control pins, the specified one of the at least one CPLD chip tests the power pins through the ADC, the ADC reads the values of the power pins, the specified one of the at least one CPLD chip reads the values of the power pins from the ADC and records the values as the power test result.

9. The DIMM slot test method without series connection of test board through JTAG according to claim 6, wherein the test data generated by the CPU based on the second test signal with JTAG signal format is differential test data, the CPU transmits the differential test data to the specified one of the at least one CPLD chip through the differential pins, the specified one of the at least one CPLD chip records the received data as a differential test result.

10. The DIMM slot test method without series connection of test board through JTAG according to claim 6, wherein the test data generated by the CPU based on the second test signal with JTAG signal format is IO test data, the CPU transmits the IO test data to the specified one of the at least one CPLD chip through the IO pins, and the specified one of the at least one CPLD chip records the received data as an IO test result.

* * * * *